United States Patent
Zhao et al.

(10) Patent No.: US 10,276,403 B2
(45) Date of Patent: Apr. 30, 2019

(54) HIGH DENSITY REDISTRIBUTION LAYER (RDL) INTERCONNECT BRIDGE USING A RECONSTITUTED WAFER

(71) Applicant: Avago Technologies International Sales Pe. Limited, Singapore (SG)

(72) Inventors: Sam Ziqun Zhao, Irvine, CA (US); Rezaur Rahman Khan, Irvine, CA (US)

(73) Assignee: Avago Technologies International Sales Pe. Limited, Singapore (SG)

( * ) Notice: Subject to any disclaimer, the term of this patent is extended or adjusted under 35 U.S.C. 154(b) by 0 days.

(21) Appl. No.: 15/198,991

(22) Filed: Jun. 30, 2016

(65) Prior Publication Data
US 2017/0365565 A1   Dec. 21, 2017

Related U.S. Application Data

(60) Provisional application No. 62/350,463, filed on Jun. 15, 2016.

(51) Int. Cl.
*H01L 23/00* (2006.01)
*H01L 21/48* (2006.01)
(Continued)

(52) U.S. Cl.
CPC ........ *H01L 21/4853* (2013.01); *H01L 21/561* (2013.01); *H01L 21/78* (2013.01);
(Continued)

(58) Field of Classification Search
CPC . H01L 2224/02371; H01L 2224/02373; H01L 2224/02379; H01L 2224/024
See application file for complete search history.

(56) References Cited

U.S. PATENT DOCUMENTS 8,558,395 B2 * 10/2013 Khan ............... H01L 23/12
257/686
8,587,132 B2 * 11/2013 Zhao ............... H01L 24/17
257/686

(Continued)

FOREIGN PATENT DOCUMENTS

EP    3096349 A1 * 11/2016 ........... H01L 21/561
EP    3096350 A1 * 11/2016 ........ H01L 23/5266
JP    WO 2015015979 A1 * 2/2015 ............. H01L 24/19

*Primary Examiner* — Earl N Taylor
(74) *Attorney, Agent, or Firm* — Sterne, Kessler, Goldstein & Fox P.L.L.C.

(57) ABSTRACT

An integrated circuit (IC) package is disclosed that contains high density interconnects to connect multiple dies. The IC package includes an encapsulated layer, a first dielectric layer, and a second dielectric layer. The encapsulated layer forms the base of the IC package and includes the multiple dies. The first dielectric layer positioned between the encapsulated layer and the second layer. The first dielectric layer includes vias to connect to the input/output pads of active surfaces of the multiple dies. The second dielectric layer includes interconnect layers where at least one of the interconnect layers forms an electrical path to connect at least two of the multiple dies together. According to embodiments of the present disclosure, the IC package enables a high manufacturing yield due to large tolerances allowed for selection of dies. Embodiments of the present disclosure also increase an amount of input/output interconnection between multiple dies in the IC package. Embodiments of the present disclosure further enable lower manufacturing costs because of the use of mature reconstituted dies and redistribution layer technologies and the lack of a need for an interposer to connect multiple dies.

20 Claims, 14 Drawing Sheets

(51) Int. Cl.
  *H01L 21/78* (2006.01)
  *H01L 21/56* (2006.01)
  *H01L 21/60* (2006.01)
  *H01L 23/31* (2006.01)

(52) U.S. Cl.
  CPC .............. *H01L 24/19* (2013.01); *H01L 24/20* (2013.01); *H01L 24/24* (2013.01); *H01L 21/568* (2013.01); *H01L 23/3128* (2013.01); *H01L 24/13* (2013.01); *H01L 24/82* (2013.01); *H01L 24/96* (2013.01); *H01L 2021/60135* (2013.01); *H01L 2224/0401* (2013.01); *H01L 2224/04105* (2013.01); *H01L 2224/12105* (2013.01); *H01L 2224/131* (2013.01); *H01L 2224/13082* (2013.01); *H01L 2224/24011* (2013.01); *H01L 2224/24101* (2013.01); *H01L 2224/24137* (2013.01); *H01L 2224/25171* (2013.01); *H01L 2224/73267* (2013.01); *H01L 2224/96* (2013.01); *H01L 2924/18161* (2013.01)

(56) References Cited

U.S. PATENT DOCUMENTS

| | | | | |
|---|---|---|---|---|
| 8,703,542 | B2* | 4/2014 | Lin | H01L 24/19 257/700 |
| 8,759,964 | B2* | 6/2014 | Pu | H01L 21/561 257/690 |
| 8,829,676 | B2* | 9/2014 | Yu | H01L 21/568 257/737 |
| 8,872,349 | B2* | 10/2014 | Chiu | H01L 23/5381 257/701 |
| 9,013,041 | B2* | 4/2015 | Karikalan | H01L 23/538 257/741 |
| 9,059,179 | B2* | 6/2015 | Karikalan | H01L 24/49 |
| 9,171,816 | B2* | 10/2015 | Teh | H01L 23/3114 |
| 9,437,569 | B2* | 9/2016 | Teh | H01L 23/3114 |
| 9,607,947 | B2* | 3/2017 | Karhade | H01L 23/5381 |
| 9,620,465 | B1* | 4/2017 | Pan | H01L 24/02 |
| 9,640,485 | B2* | 5/2017 | Liu | H01L 23/5381 |
| 9,642,259 | B2* | 5/2017 | Kim | H01L 23/5385 |
| 2009/0020864 | A1* | 1/2009 | Pu | H01L 21/561 257/687 |
| 2013/0062761 | A1* | 3/2013 | Lin | H01L 23/49816 257/738 |
| 2014/0091474 | A1* | 4/2014 | Starkston | H01L 23/5385 257/774 |
| 2014/0117552 | A1* | 5/2014 | Qian | H01L 23/49827 257/762 |
| 2014/0159228 | A1* | 6/2014 | Teh | H01L 23/3114 257/734 |
| 2014/0332966 | A1* | 11/2014 | Xiu | H01L 23/293 257/773 |
| 2014/0353827 | A1* | 12/2014 | Liu | H01L 24/33 257/751 |
| 2015/0001717 | A1* | 1/2015 | Karhade | H01L 24/17 257/741 |
| 2015/0001733 | A1* | 1/2015 | Karhade | H01L 23/538 257/774 |
| 2015/0028486 | A1* | 1/2015 | Liu | H01L 23/48 257/773 |
| 2015/0084210 | A1* | 3/2015 | Chiu | H01L 24/23 257/778 |
| 2015/0116965 | A1* | 4/2015 | Kim | H05K 1/11 361/767 |
| 2015/0221714 | A1* | 8/2015 | Gu | H01L 23/5223 257/532 |
| 2015/0270232 | A1* | 9/2015 | Chen | H01L 21/4846 257/691 |
| 2015/0371915 | A1* | 12/2015 | Hashimoto | H01L 23/562 257/531 |
| 2016/0056126 | A1* | 2/2016 | Yu | H01L 21/565 257/737 |
| 2016/0085899 | A1* | 3/2016 | Qian | G06F 17/5077 257/774 |
| 2016/0133571 | A1* | 5/2016 | Lee | H01L 21/56 257/774 |
| 2016/0141234 | A1* | 5/2016 | We | H01L 23/5385 361/767 |
| 2016/0329284 | A1* | 11/2016 | We | H01L 25/0652 |
| 2017/0011961 | A1* | 1/2017 | Peng | H01L 24/06 |
| 2017/0012010 | A1* | 1/2017 | Peng | H01L 24/06 |
| 2017/0012011 | A1* | 1/2017 | Peng | H01L 24/06 |
| 2017/0110421 | A1* | 4/2017 | Liu | H01L 24/02 |
| 2017/0141053 | A1* | 5/2017 | Chen | H01L 23/5389 |

* cited by examiner

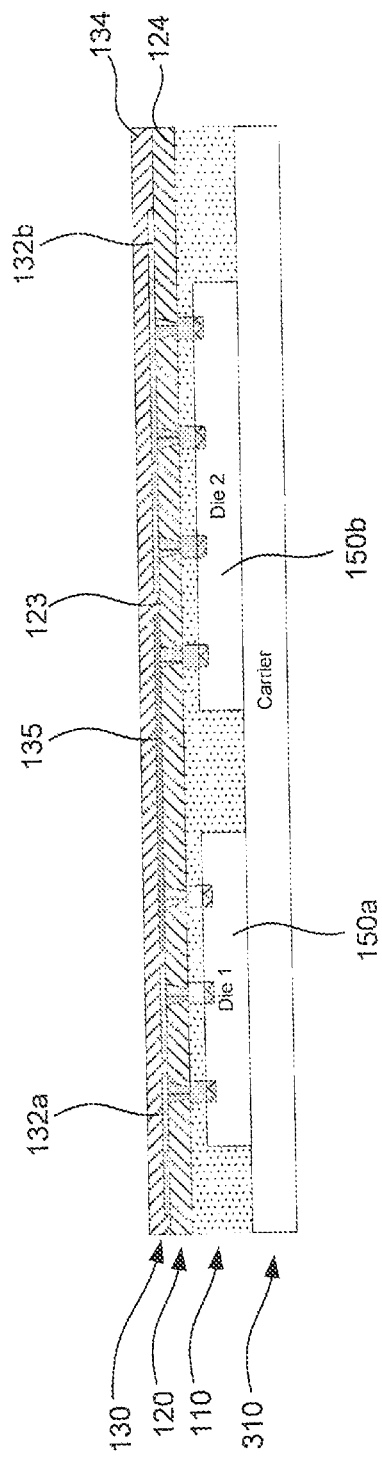
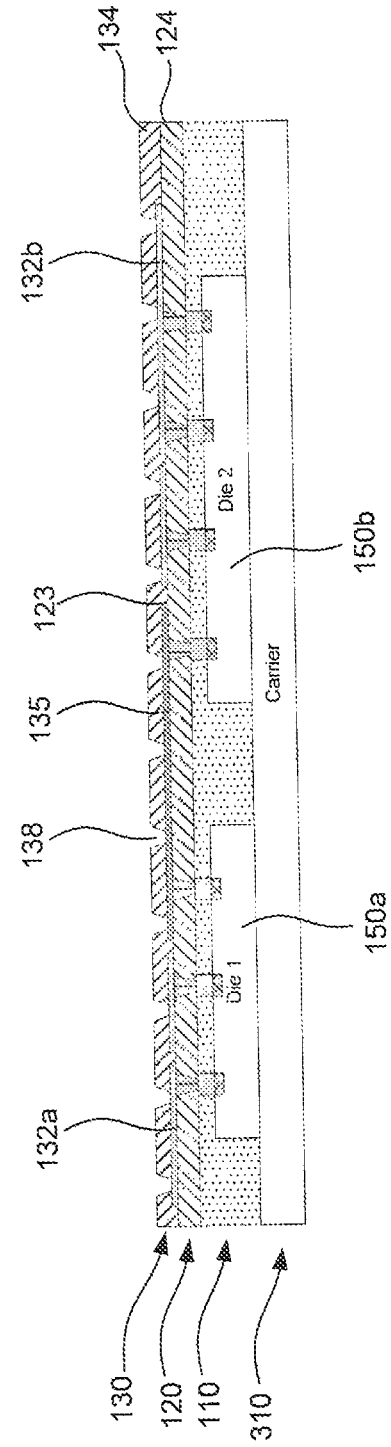

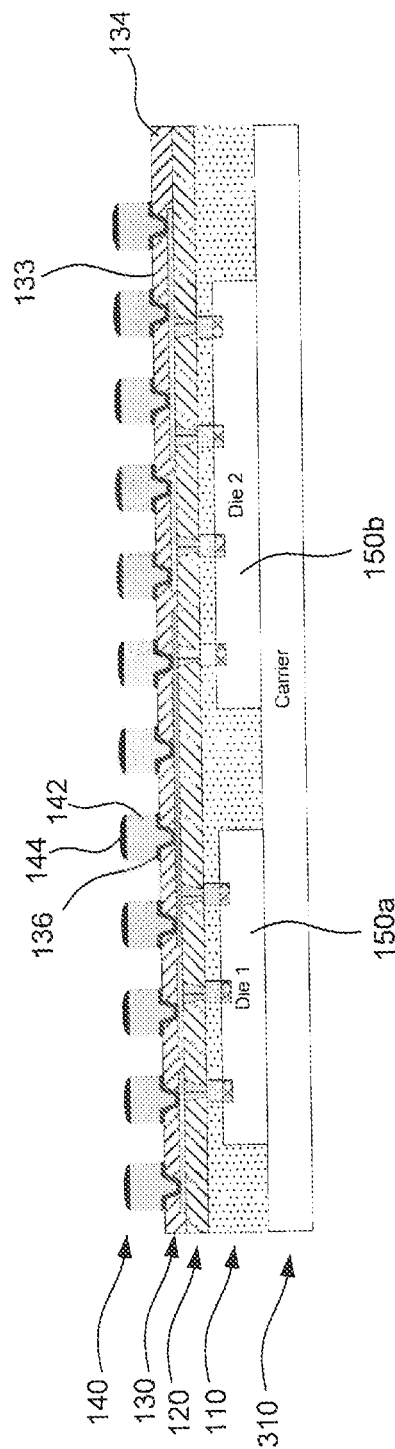
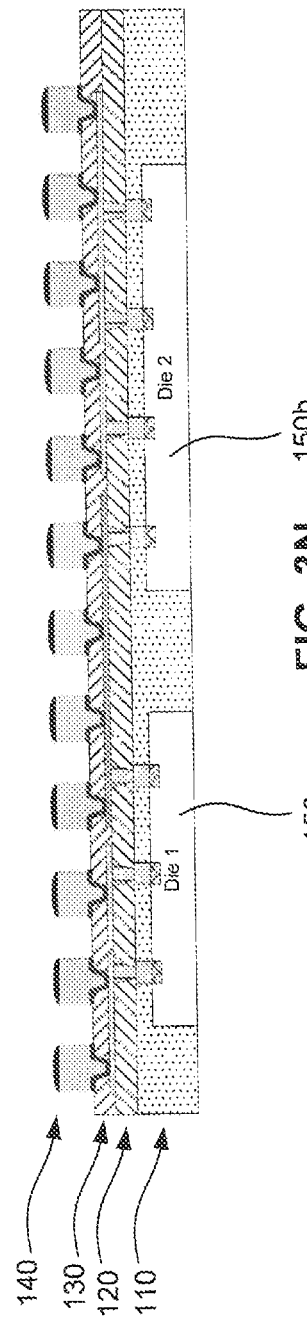

HIGH DENSITY REDISTRIBUTION LAYER (RDL) INTERCONNECT BRIDGE USING A RECONSTITUTED WAFER

CROSS REFERENCE TO RELATED APPLICATIONS

The present application claims the benefit of U.S. Provisional Patent Application No. 62/350,463, filed on Jun. 15, 2016, which is hereby incorporated by reference in its entirety.

BACKGROUND

Field

Embodiments described herein generally relate to integrated circuit (IC) device packaging technology.

Background Art

In modern technologies, multiple chips are used in integrated circuit (IC) packages to provide a broader range of results such as multi-processing or low and high operating power functions for electronics that include these IC packages. In addition to connecting to external components, the input/output (I/O) interconnect between the multiple chips requires a high density interconnect such that a quality signal between the multiple chips is achieved.

BRIEF DESCRIPTION OF THE DRAWINGS/FIGURES

The accompanying drawings, which are incorporated herein and form a part of the specification, illustrate embodiments of the present disclosure and, together with the description, further serve to explain the principles of the disclosure and to enable a person skilled in the pertinent art to make and use the embodiments.

The present disclosure will be described with reference to the accompanying drawings. The drawing in which an element first appears is typically indicated by the leftmost digit(s) in the corresponding reference number.

DETAILED DESCRIPTION

Methods, systems, and apparatuses for integrated circuit (IC) device packaging technology are described herein. In particular, methods, systems, and apparatuses for interconnecting multiple dies in an IC package to form an improved IC package are described.

References in the disclosure to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

Overview

An integrated circuit (IC) package is disclosed that contains high density interconnects to connect multiple IC dies disposed within. The IC package includes an encapsulated layer, a first dielectric layer, and a second dielectric layer. The encapsulated layer forms the base of the IC package and includes the multiple dies. The first dielectric layer positioned between the encapsulated layer and the second dielectric layer. The first dielectric layer includes vias to connect to the input/ouput (I/O) pads of the multiple dies. The second dielectric layer includes interconnect layers where at least one of the interconnect layers forms an electrical path to connect at least two of the multiple dies together. According to embodiments of the present disclosure, the IC package enables a high manufacturing yield due to large tolerances allowed for selection of IC dies. Embodiments of the present disclosure also increase an amount of I/O interconnection between multiple IC dies in the IC package. Embodiments of the present disclosure further enable lower manufacturing costs because of the use of mature reconstituted dies and redistribution layer processing technologies, and the lack of a need for an interposer to connect the multiple dies.

Exemplary IC Package Having Die Connectors

Figure 1:
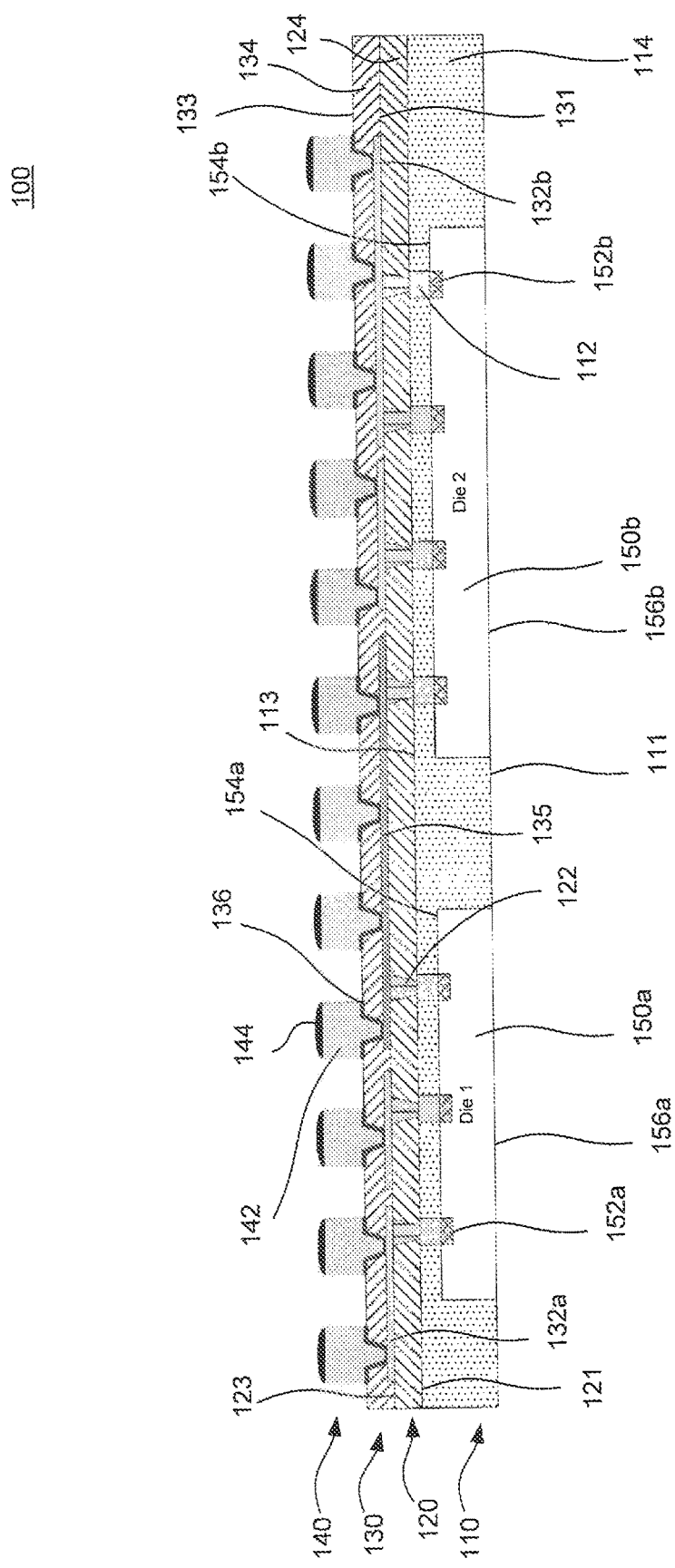
FIG. 1 illustrates a cross-sectional view of an integrated circuit (IC) chip package according to embodiments of the disclosure.

FIG. 1 illustrates a cross-sectional view of an integrated circuit (IC) chip package according to embodiments of the disclosure. As shown by FIG. 1, IC package 100 includes multiple layers. In particular, the IC package 100 includes a reconstituted layer 110, a first dielectric layer 120, a second dielectric layer 130, and an external connect layer 140.

The reconstituted layer 110 includes at least two IC dies 150a and 150b, die connectors 112, and an encapsulating material 114. The IC dies 150a and 150b are reconstituted dies that can be the same die type or a different type of die. The dies 150a and 150b include respective input/output (I/O) pads 152a and 152b arranged on respective active surfaces 154a and 154b of the IC dies 150a and 150b. The 170 pads 152a and 152b provide interface connections to connect active surfaces 154a and 154b of the IC dies 150a and 150b to other portions of the IC package 100.

The die connectors 112 provide an electrical, connection path from the I/O pads 152a and 152b to the other portions of the IC package 100. The die connectors 112 are, for example, conductive pillars formed of a conductive material such as copper, gold, silver, or aluminum.

The encapsulating material 114 encapsulates the IC dies 150a and 150b to hold a relative location of the IC dies 150a and 150b and provide protection from the environment. The encapsulating material 114 covers at least three surfaces of the IC dies 150a and 150b including the active surfaces 154a and 154b. The encapsulating material 114 is made of a mold compound or an epoxy material. The encapsulating material 114 forms the surfaces of the reconstituted layer 110. Accordingly, the encapsulating material 114 forms a first surface 111 and a second surface 113 of the reconstituted layer 110. During manufacturing, the encapsulating material 114 is configured to leave non-active surfaces 156a and 156b of the respective IC dies 150a and 150b exposed at the first surface 111 to facilitate manufacturing and connection to an external component such as a heat spreader (see e.g., FIGS. 6A-6B).

The first dielectric layer 120 is arranged on the second surface 113 of the reconstituted layer 110. The first dielectric layer 120 includes vias 122 and a first dielectric material 124. The vias 122 are disposed on the die connectors 112 to provide electrical paths between the die connectors 112 and the second dielectric layer 130. The vias 122 are made of a conductive material such as copper, gold, silver, or aluminum. The first dielectric material 124 encapsulates the vias 122 and forms the surfaces of the first dielectric layer 120. In particular, the first dielectric material 124 forms a first surface 121 and a second surface 123 of the first dielectric layer 120. The first dielectric material 124 can be formed of such material as polybenzoxazoles, polyimides, benzocyclobutene, silicone elastomers, acrylate, silicon oxide, or high K dielectric material, or an epoxy.

As illustrated by FIG. 1, the second dielectric layer 130 is arranged on the second surface 123 of the first dielectric layer 120. The second dielectric layer 130 includes redistribution layers (RDLs) 132a and 132b, a bridge interconnect layer 135, a second dielectric material 134, and an under bump metallization (UBM) layer 136. The RDLs 132a and 132b and the bridge interconnect layer 135 are conductive metal layers configured to distribute the electrical connection paths from the vias 122 of the first dielectric layer 120 to the external connect layer 140. The bridge interconnect layer 135 additionally provides a conductive interconnect between the dies 150a and 150b. The RDLs 132a and 132b and the bridge interconnect layer 135 can distribute the electrical paths by way of metal leads or metal traces for electrical signal distribution. The RDLs 132a and 132b and the bridge interconnect layer 135 include a conductive material such as copper, gold, silver, or aluminum. While FIG. 1, and similarly FIGS. 3I-3O, illustrate the RDLs 132a and 132b with multiple metal traces and the bridge interconnect layer 135 with one metal trace, it will be apparent to those skilled in the relevant art that both the RDLs and the bridge interconnect layer 135 can each comprise one or more metal traces.

The second dielectric material 134 encapsulates the RDLs 132a and 132b and the bridge interconnect layer 135 and forms the surfaces of the second dielectric layer 130. Accordingly, the second dielectric material 134 forms a first surface 131 and a second surface 133 of the second dielectric layer 130. The second dielectric material 134 is formed of a material that facilitates substantial reduction of mechanical stresses on the IC package 100 as well as minimizing warpage of IC package 100. The second dielectric material 134 may be formed of the same material as the first dielectric material 124, or of a different material. The second dielectric material 134 can be formed of such material as polybenzoxazoles, polyimides, benzocyclobutene, silicone elastomers, acrylate, silicon oxide, or high K dielectric material, and/or an epoxy. The UBM layer 136 comprises a plurality of conductive deposits and is configured to provide electrical connection paths between (a) the RDLs 132a and 132b and the bridge interconnect layer 135 and (b) the external connect layer 140. Further, the UBM layer 136 is configured as a foundation or base to support the external connect layer 140. The UBM layer 136 is formed of a conductive material such as copper, gold, silver, or aluminum.

The external connect layer 140 is configured to provide an electrical connection path between the second dielectric layer 130 and an external component such as a substrate for a flip chip package (see e.g., FIG. 3O). As illustrated by FIG. 1, the external connect layer 140 includes conductive pillars 142 and solder bumps 144 that are disposed on the UBM layer 136. Each of the conductive pillars 142 includes a portion that contacts one of the plurality of conductive deposits of the UBM layer 136, where the conductive deposits form recessed areas of the UBM layer 136 to receive the conductive pillars. Further each of the conductive pillars 142 provides a surface for one of the solder caps 144 to be formed. The conductive pillars 142 are made of a conductive material such as copper, gold, silver, or aluminum. The solder caps 144 are configured to facilitate an electrical connection between the IC package 100 to an external device. The solder caps 144 are made of a conductive material such as tin and/or silver.

In an exemplary embodiment, the IC die connectors 112, the vias 122, the RDLs 132, the bridge interconnect layer 135, the UBM layer 136, and the conductive pillars 142 are all formed of the same conductive material to reduce contact resistance between these different layers. However, in other embodiments, one or more of the IC die connectors 112, the vias 122, the RDLs 132a and 132b, the bridge interconnect layer 135, the UBM layer 136, or the conductive pillars 142 can be formed of a different conductive material.

Accordingly, embodiments of the present disclosure provide an IC package having reconstituted dies in a wafer process, which enables a high manufacturing yield due to large tolerances allowed for selection of dies. Embodiments of the present disclosure also increase an amount of input/output interconnection between multiple dies in the IC package. Embodiments of the present disclosure further enable lower manufacturing costs because of the use of mature reconstituted dies and RDL technologies and the elimination of an interposer to connect multiple dies.

Exemplary Manufacturing Process

Typical IC packages require the use of an interposer to perform die-to-die interconnection. Interposers, using through-silicon-via (TSV) technology typically increases manufacturing costs. Alternatively, TSV-less interposers require dies to be attached after the interposer layer is manufactured, which limits the use of a wafer process during the manufacturing process or requires new manufacturing equipment and technologies to accurately attach dies to the TSV-less interposer. However, an IC package in accordance with embodiments of the present disclosure allows a die-to-die interconnect process to be performed using a wafer format or a panel format. Thus, an overall size of the IC package is reduced because no interposer layer is required and an overall cost of manufacturing is reduced.

A process of manufacturing the IC package 100 will be described with respect to FIGS. 2, 3A-3O, and 4A-4B. Although the structures that form IC package 100 have largely already been described, additional details regarding more nuanced portions of the structure will be described below with respect to FIG. 1.

Figure 2:
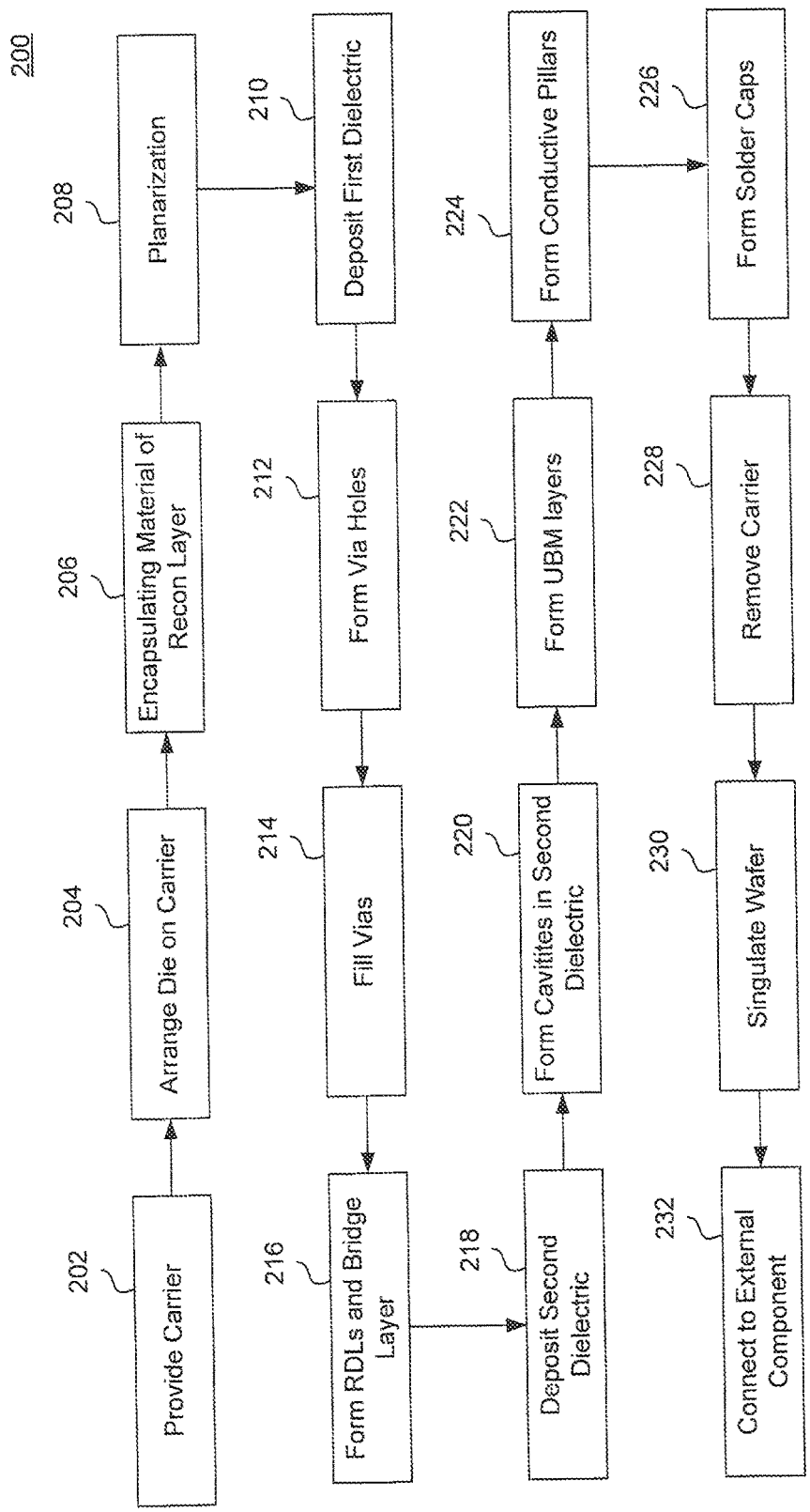
FIG. 2 illustrates a flowchart diagram, of a method of manufacturing the IC chip package of FIG. 1 according to embodiments of the present disclosure.
Figure 3A:
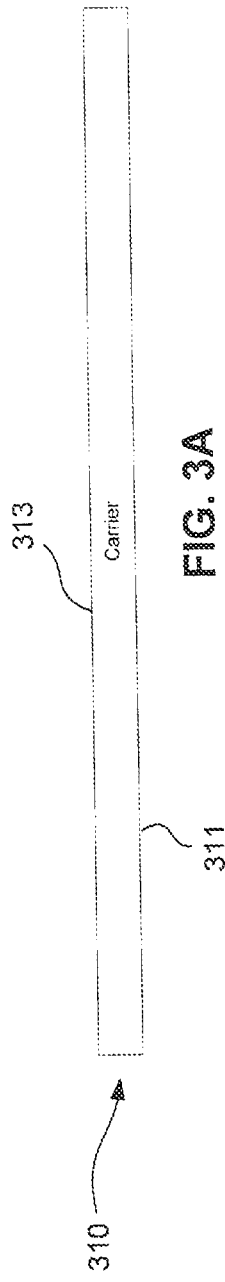
FIGS. 3A-3O illustrate cross-sectional views of the manufacturing process of the IC chip package of FIG. 1 according to embodiments of the disclosure.
Figure 4B:
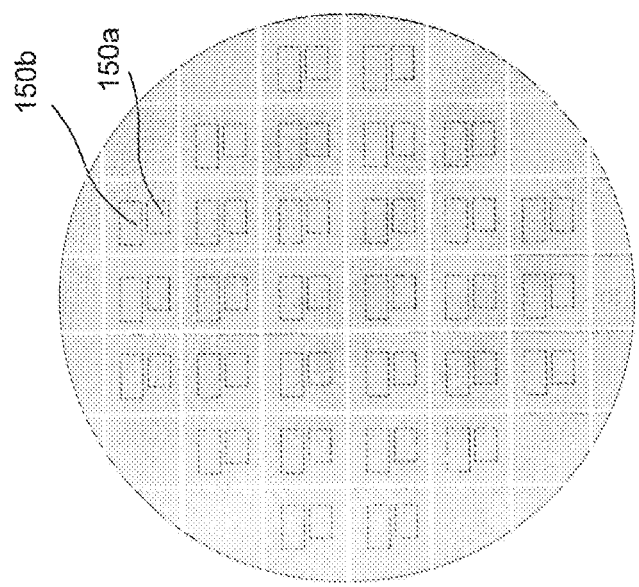
FIGS. 4A-4B illustrates pan views of the manufacturing process of the IC chip package of FIG. 1 according to embodiments of the disclosure.
Figure 4A:
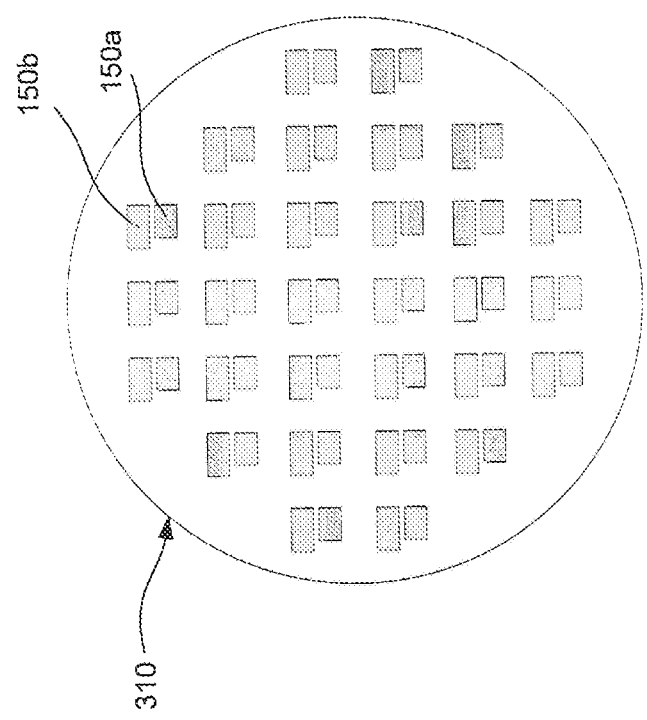

FIG. 2 illustrates a flow diagram of a manufacturing process of the IC package of FIG. 1, according to embodiments of the disclosure. FIGS. 3A-3O illustrate cross-sectional views of the manufacturing process of the IC chip package of FIG. 1, according to embodiments of the disclosure. FIGS. 4A and 4B are top-down views of a carrier 310 during a manufacturing process of a plurality of IC packages including the IC chip package of FIG. 1, according to embodiments of the disclosure. Herein, the steps of FIG. 2 will be described with reference to the IC package structural change illustrated in FIGS. 3A-3O and 4A-4B. In step 202, as shown by FIGS. 2 and 3A, a carrier 310 is provided as a base on which the IC package 100 can be formed. The carrier 310 includes a first surface 311 and a second surface 313 on which the plurality of IC packages are formed, including IC package 100. The carrier 310 can be a typical metal carrier used during wafer processing.

Figure 3B:
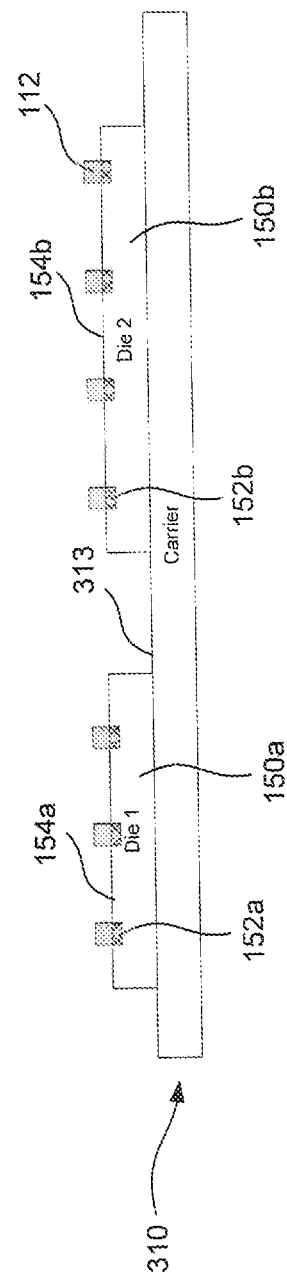
Figure 3C:
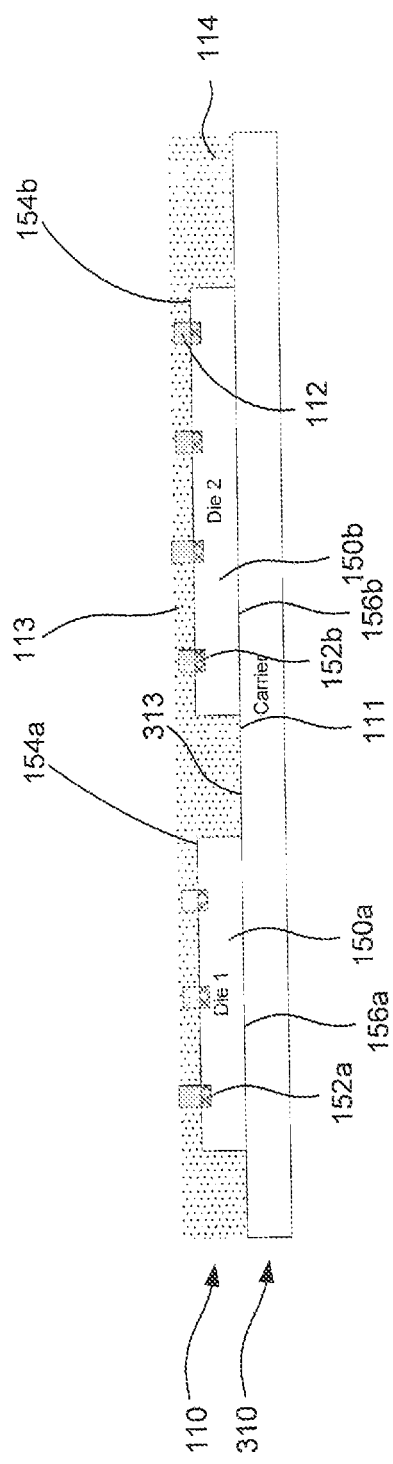
Figure 3D:
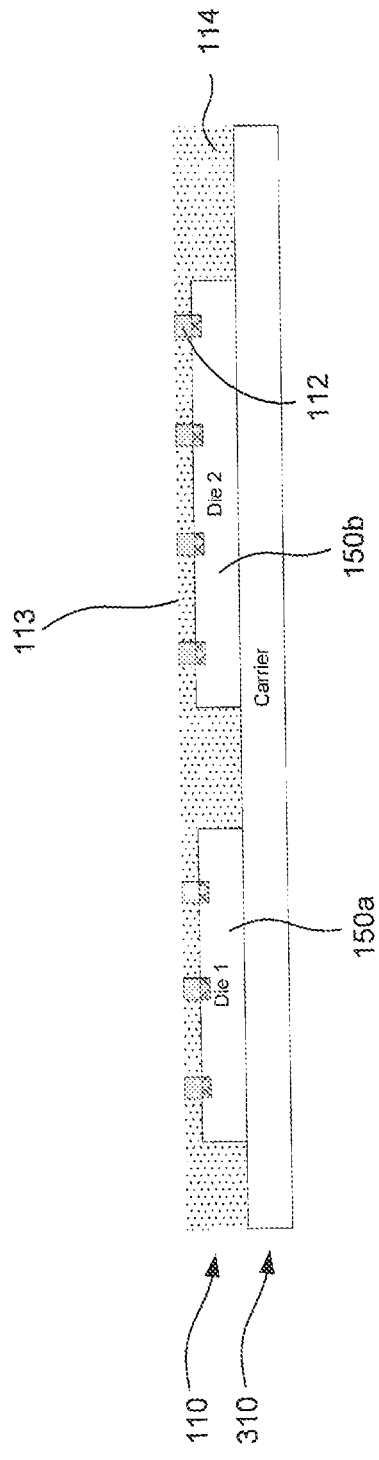

Next, in step 204, as shown by FIGS. 3B and 4A, the dies 150a and 150b are arranged on the carrier 310. In particular, the non-active surfaces 156a and 156b of the IC dies 150a and 150b are arranged on the second surface 313 of the carrier 310. (Herein non-active surface refers to a ground plane or other surface absent active circuitry [e.g. transistors and electrical interconnect structures] and intended for package attachment). Next, in step 206, as shown in FIG. 3C, the encapsulating material 114 is deposited over IC dies 150a and 150b to form the reconstituted layer 110. As shown by FIG. 3C, the encapsulating material 114 encapsulates the die connectors 112 and at least the active surfaces 154a and 154b of the dies 150a and 150b, fixes a relative location of the dies 150a and 150b to each other, and provides a base on which the first dielectric layer 120 can be formed. In step 208, as shown in FIG. 3D, a planarization process is then performed on the reconstituted layer 110. In particular, the planarization process is performed on the second surface 113 of the reconstituted layer 110 to expose all the die connectors 112. In detail, because the first and second IC dies 150a and 150b can be a different type, each of the IC dies 150a and 150b may have a different shape or size. Accordingly, the planarization process facilitates a level surface for deposition of the first dielectric layer 120 in the follow-on steps. The planarization process may be performed by grinding, etching, chemical removal, or thermal pressing of the reconfigured wafer. However, in another embodiment, step 208 may be omitted during the manufacturing of the IC package 100, for example, the planarization process may be omitted if the die connectors 112 are already exposed after the encapsulating material 114 is deposited on the IC dies 150a and 150b.

Figure 3E:
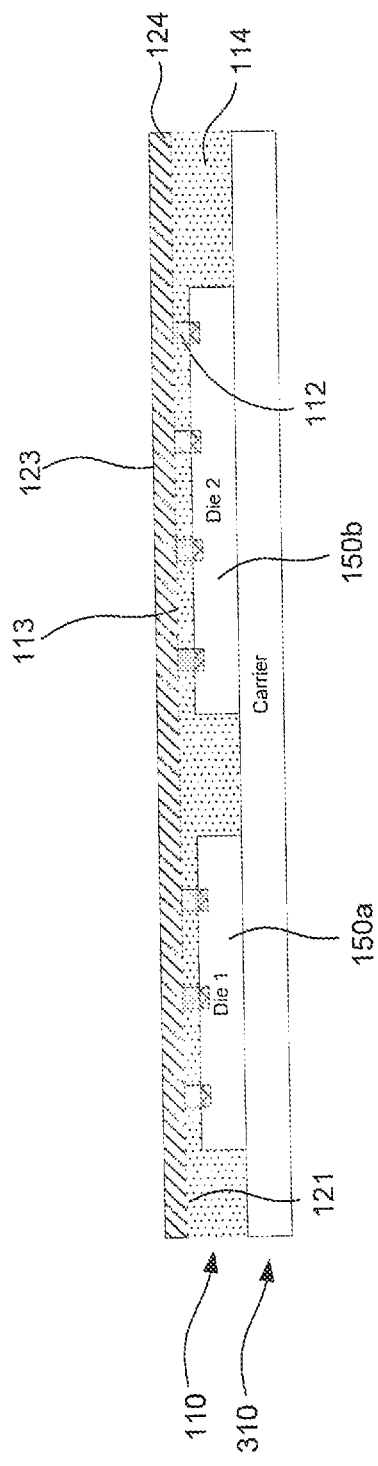
Figure 3F:
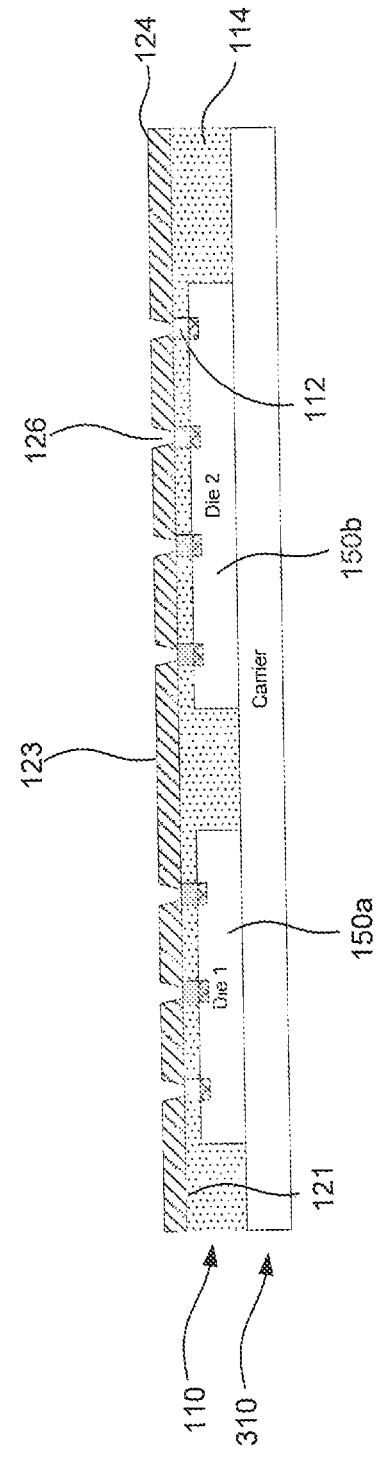
Figure 3G:
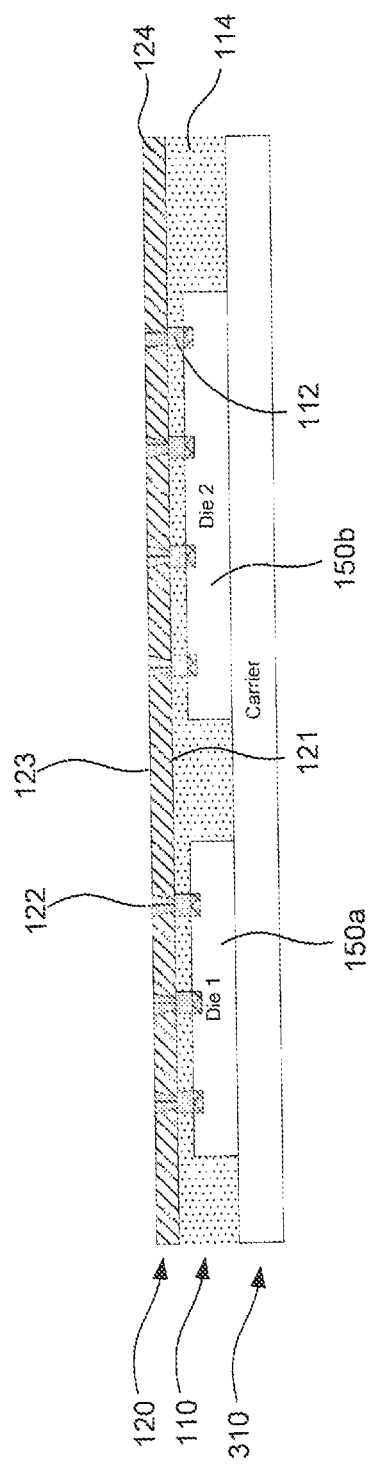

Next, in step 210, as shown in FIG. 3E, the first dielectric material 124 is deposited on the second surface 113 of the reconstituted layer 110 to provide a base on which the second dielectric layer 130 is formed. In step 212, as shown in FIG. 3F, via holes 126 are then formed in the first dielectric layer 120, where the via holes 126 expose a surface of the IC die connectors 112. The via holes 126 can be formed by etching, chemical removal, or laser or mechanical drill. In step 214, as shown in FIG. 3G, the vias 122 are formed within the via holes 126, by a metal deposition process or a metal layering process to fill the via holes 126 with conductive material. In an embodiment, a further planarization process can be performed on the second surface 123 of the first dielectric layer 120 after the interconnect vias 122 are formed.

Figure 3H:
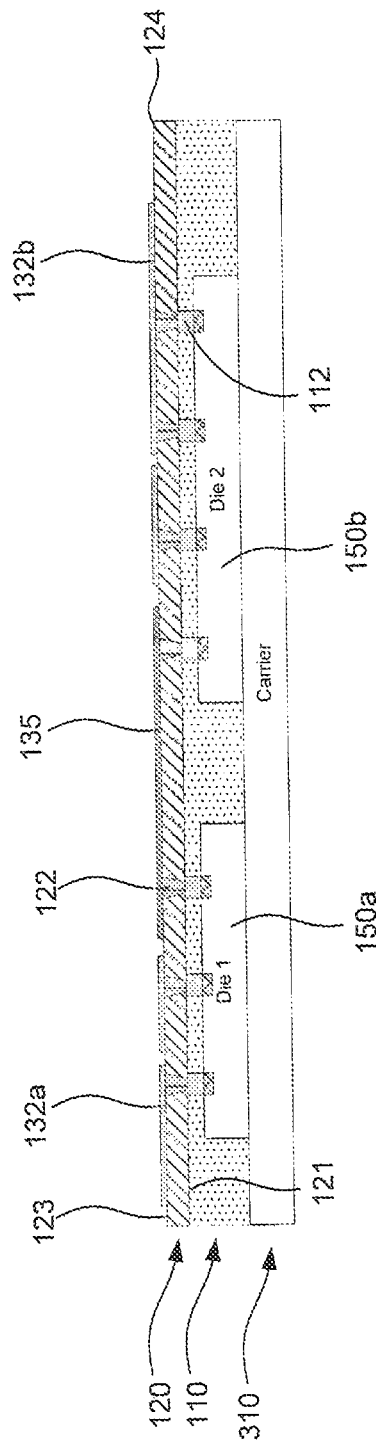
Figure 3K:
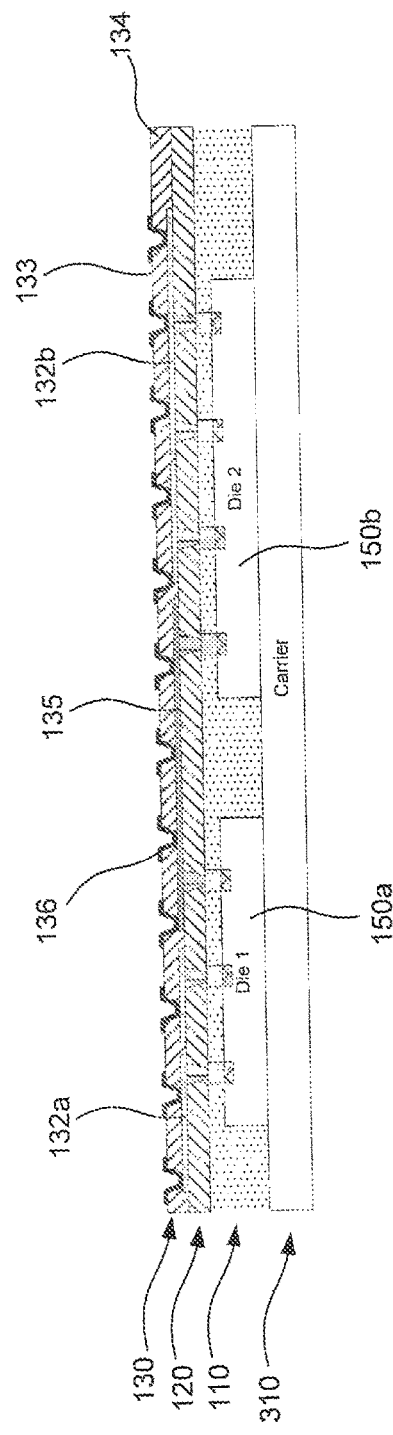

In step 216, as shown by FIG. 3H, the RDLs 132a and 132b and bridge interconnect layer 135 are formed on the second surface 123 of the first dielectric layer 120. The RDLs 132a and 132b and the bridge interconnect layer 135 can be formed by metal deposition process to fabricate the metal traces that form the RDLs 132a and 132b and the bridge interconnect 135. Both the RDLs 132a and 132b and the bridge interconnect layer 135 can include multiple metal layers separated by intervening dielectric layers between the metal layers in order to provide a multi-layer construct. In step 218, as shown by FIG. 3I, the second dielectric material 134 is deposited on the second surface 123 of the first dielectric material 124, the RDLs 132a and 132b, and the bridge interconnect layer 132. The second dielectric material 134 provides a base on which the external connect layer 140 can be formed, in a follow-on step. In step 220, as shown by FIG. 3J, via holes 138 are then formed in the second dielectric material 134. The cavities 138 can be formed by etching, laser or mechanical drill, or selective chemical removal of the second dielectric material 134 such that portions of the RDL, 132a and bridge interconnect layer 135 are exposed. In an embodiment, a planarization process can be performed on the second surface 133 of the second dielectric layer 130 prior to further processing. In step 222, the UBM layer 136 is formed, as shown by FIG. 3K, on the surfaces of the cavities 138 and on the second surface 133 of the second dielectric layer 130. The UBMs 136 can be formed by a metal deposition process such as a plating method to plate the cavities 138 with conductive metal deposits as shown.

Figure 3L:
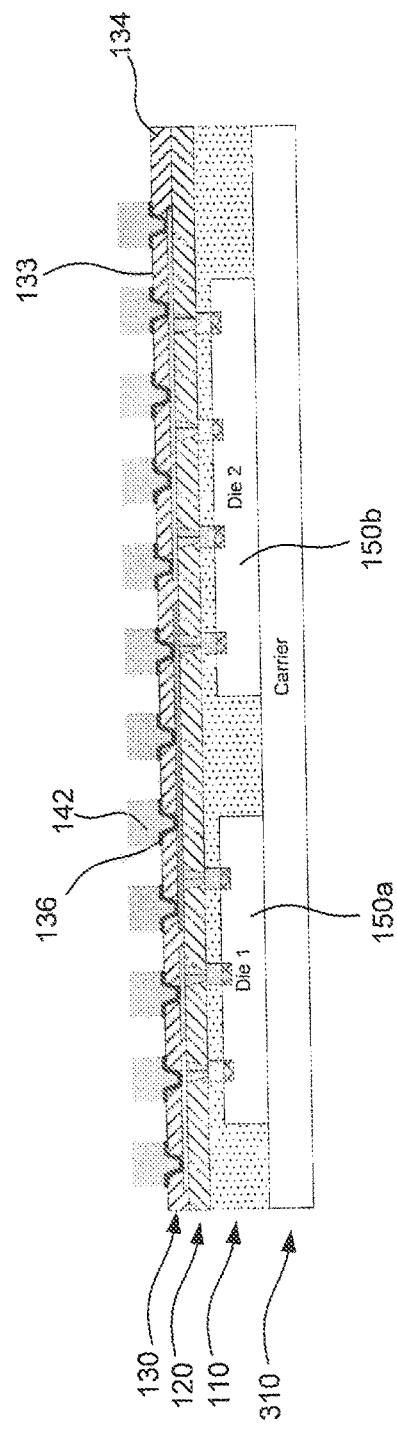
Figure 30:
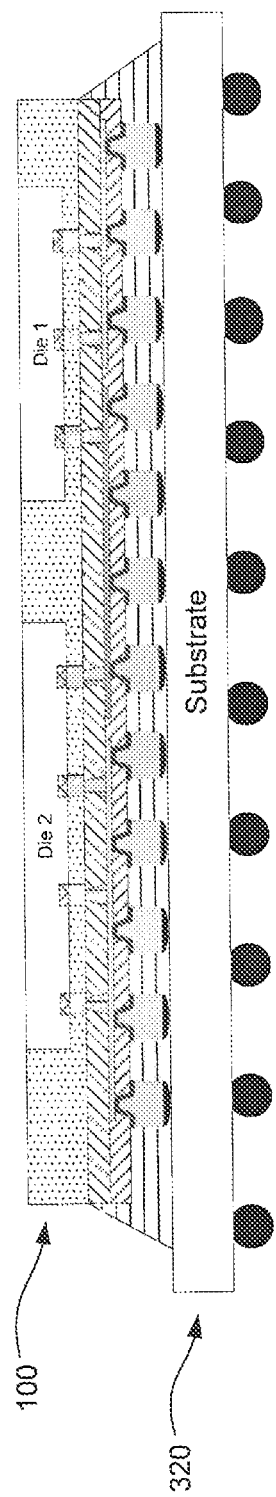

Next, in step 224, as shown by FIG. 3L, the conductive pillars 142 are formed within the plated cavities of the UBM layer 136. The conductive pillars 142 extend onto and away from the second surface 133 of the second dielectric layer 130. The conductive pillars 142 are formed by a bonding process or a metal layering process. In step 226, as shown by FIG. 3M, the solder caps 144 are attached to a surface of the conductive pillars 142, using a solder plating and reflow process.

At this point in the fabrication process, a wafer is fully formed on the carrier 310. Next, in step 228, as illustrated by FIG. 3N, the carrier 310 is removed leaving only the wafer. It will be apparent to those skilled in the relevant art that any removal process of the temporary bonded carrier 310 such as UV light de-taping, grinding, or chemical removal may be used to remove the carrier 310. In step 230, as shown by FIG. 4B, the wafer is singulated by cutting the wafer into individual IC packages. At this point, an IC package, such as the IC package 100, is formed and can be attached, in step 232, to an external component such as a substrate 320, as shown by FIG. 3O. In this step, the solder bumps 144 are bonded to corresponding connections on the substrate 320 by way of a metal reflow process. However, in another embodiment, step 232 may be omitted during the manufacturing of the IC package 100.

While FIGS. 2, 3A-3O, and 4A-4B contain steps of a manufacturing process, it will be apparent to those skilled in the relevant are that in other embodiments of the present disclosure one or more of the steps may be performed in a different order, may be omitted, may be repeated, and/or additional steps may be added according to the connection needs and function of the IC package 100, and the manufacturing process of an IC package manufacture. A few examples of the arrangement of steps are provided below along with other exemplary embodiments.

Exemplary IC Package without Die Connectors

Figure 5:
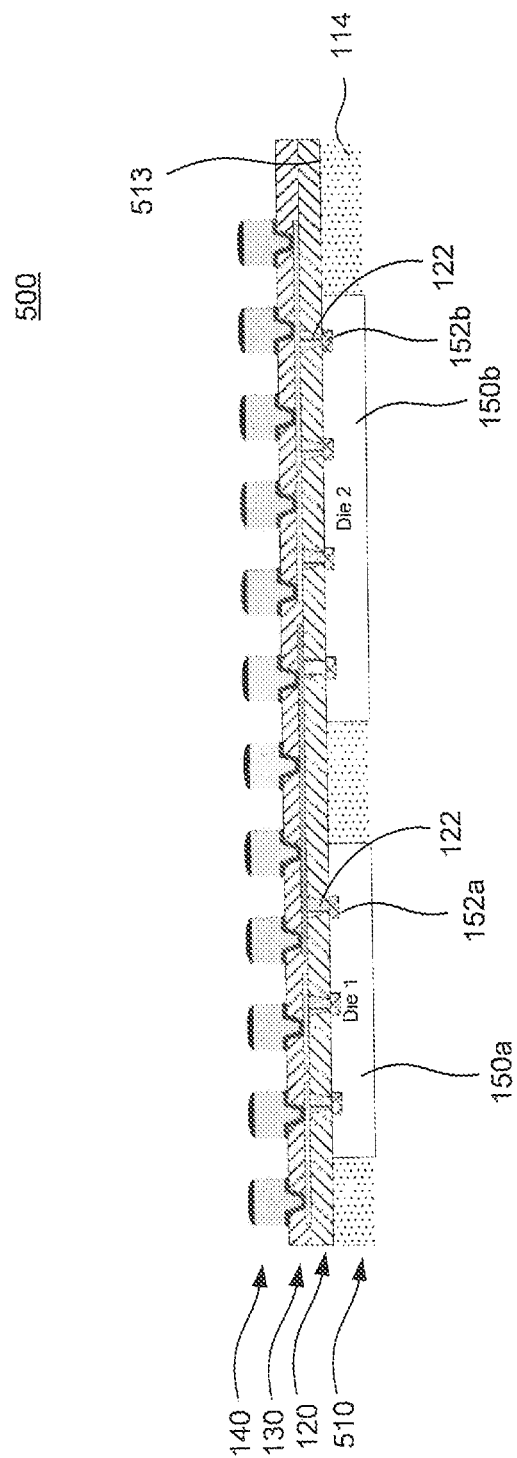
FIG. 5 illustrates a cross-sectional view of an integrated circuit (IC) chip package according to embodiments of the disclosure.

FIG. 5 illustrates another embodiment of an IC package according to embodiments of the disclosure. As illustrated by FIG. 5, an IC package 500 can be formed without the die connectors 112. For example, the IC package 500 includes a reconstituted layer 510, the first dielectric layer 120, the second dielectric layer 130, and the external connect layer 140. The reconstituted layer 510 includes the IC dies 150a and 150b having I/O pads 152a and 152b, respectively. However, the reconstituted layer 510 does not include the die connectors 112. Instead, the vias 122 contact the I/O pads 152a and 152b to shorten an electrical connection path from the I/O pads 152a and 152b to the vias 122. Further, by not including the die connectors 112, the overall thickness of the IC package 500 is reduced in comparison to the IC package 100.

During manufacturing, steps 202-206 are performed as described above to form the reconstituted layer 510. Planarization may then be performed on the second surface 513 of the reconstituted layer 110 to expose the I/O pads 152a and 152b. However, in an embodiment, the planarization process is omitted when forming the IC package 500. Next, the first dielectric material 124 is formed on the second surface 513 of the reconstituted layer 510, and via holes 126 are then formed to expose a surface of the I/O pads 152a and 152b through the first dielectric material 124. After, steps 214-232 are performed in the manufacturing process, as previously described.

Exemplary IC Package with Heat Spreader

Figure 6A:
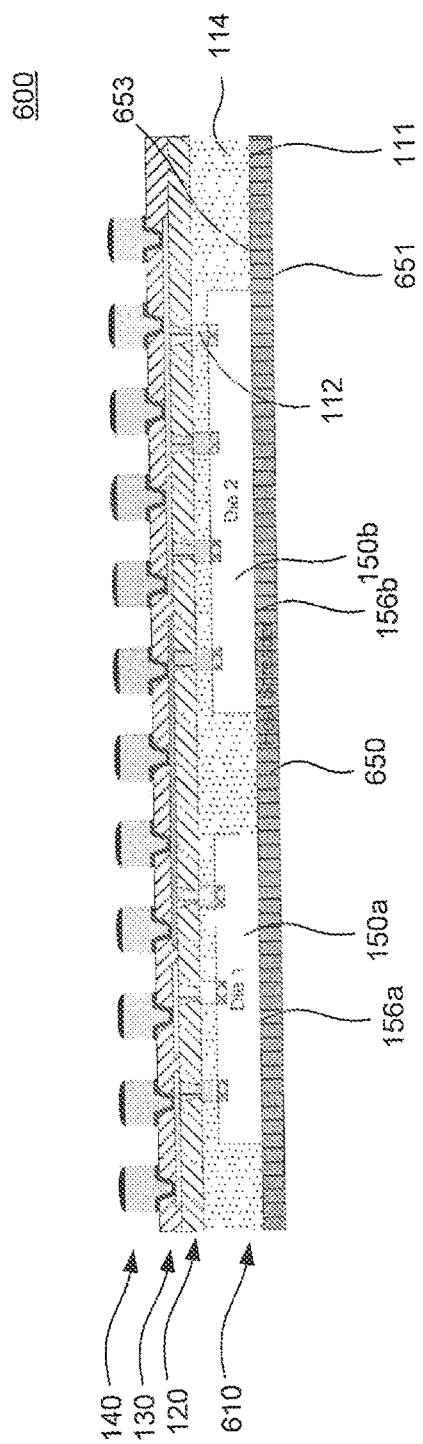
FIGS. 6A-6B illustrates cross-sectional views of integrated circuit (IC) chip packages according to embodiments of the disclosure.
Figure 6B:
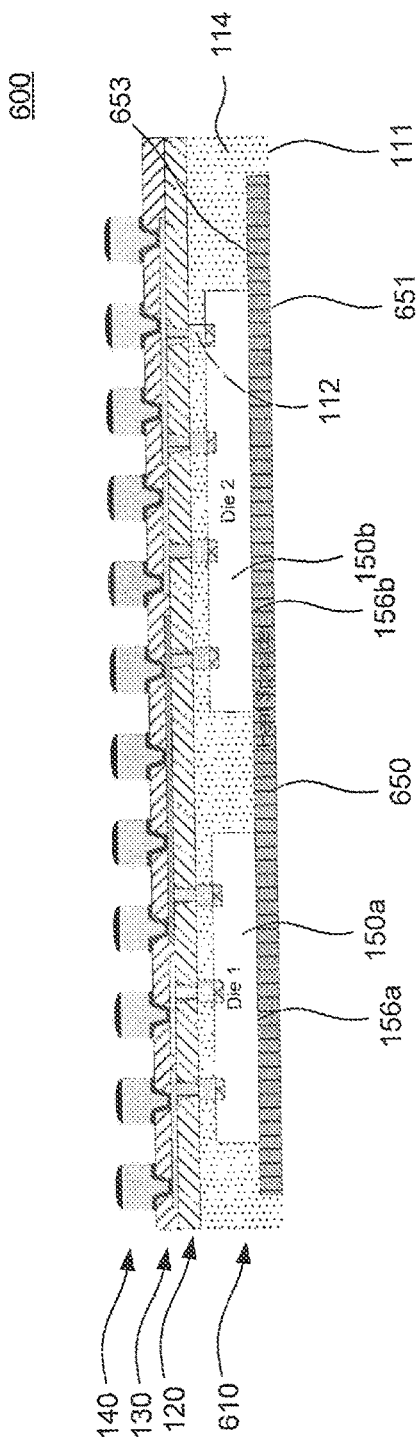

FIGS. 6A and 6B illustrate other embodiments of an IC package according to embodiments of the disclosure. As illustrated by FIGS. 6A and 6B, an IC package 600 can include a heat spreader 650. The heat spreader 650 is configured to dissipate heat from the IC package 600. For example, the IC package 600 includes a reconstituted layer 610, the first dielectric layer 120, the second dielectric layer 130, and the external connect layer 140. The reconstituted layer 610 includes the heat spreader 650 along with the dies 150a and 150b. The heat spreader 650 includes first and second surfaces 651 and 653. The non-active surfaces 156a and 156b of the IC dies 150a and 150b are arranged on the second surface 653 of the heat spreader 650. As shown by FIG. 6A, the heat spreader 650 can be arranged within the reconstituted layer 610 such that the encapsulating material 114 is formed on only the second surface 653 of the heat spreader 650. However, in other embodiments, the heat spreader 650 can be arranged such that additional surfaces of the heat spreader 650 contact the encapsulating material 114, as shown by FIG. 6B.

During manufacturing, after step 202 is performed, the heat spreader 650 is arranged on the carrier 310 prior to the dies 150a and 150b being arranged on the carrier 310 in step 204. Following the arrangement of the heat spreader 650, the remaining steps 204-232 can be performed in the manufacturing process, as previously described. In another embodiment, steps 202-228 are performed, as previously describe, and then the heat spreader 650 is attached to the first surface 653 after the removal of the carrier 310, in step 228.

Exemplary IC Package with Additional Encapsulated Material

Figure 7:
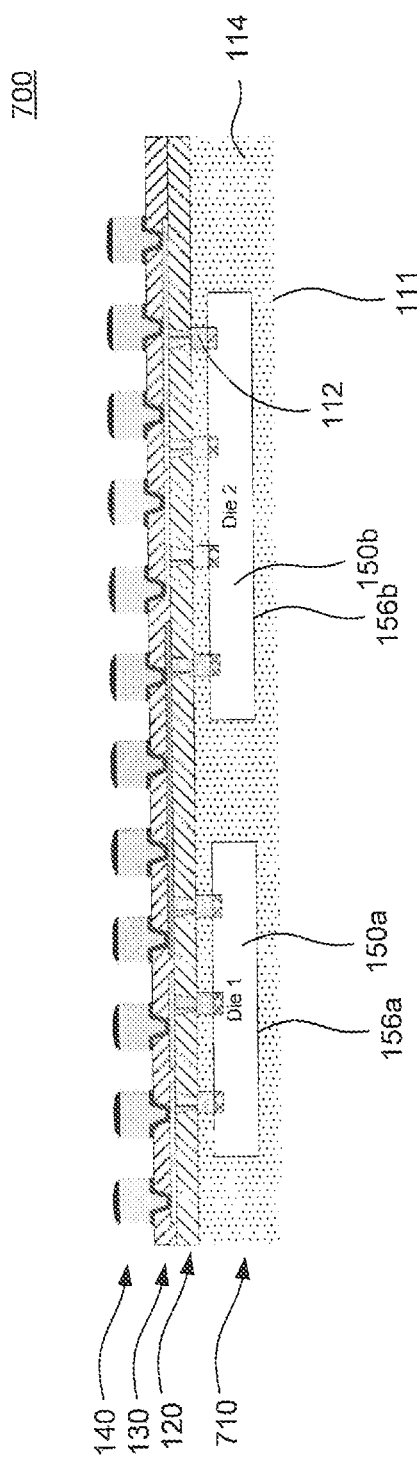
FIG. 7 illustrates a cross-sectional view of an integrated circuit (IC) chip package according to embodiments of the disclosure.

FIG. 7 illustrates another embodiment of an IC package according to embodiments of the disclosure. As illustrated by FIG. 7, an IC package 700 includes the encapsulated material 114 which surrounds the IC dies 150A and 150B to protect the IC dies 150a and 150b from the environment. For example, the IC package 700 includes a reconstituted layer 710, the first dielectric layer 120, the second dielectric layer 130, and the external connect layer 140. The reconstituted layer 710 includes a portion of the encapsulated material 114 that contacts the non-active surfaces 156a and 156b of the IC dies 150a and 150b and another portion of the encapsulated material surrounds remaining surfaces the IC dies 150a and 150b.

During manufacturing, the IC dies 150a and 150b are arranged on the carrier 310, with the active surfaces 154a of the IC dies 150a and 150b contacting the carrier 310 using the die connectors 112 as shown. Next, the encapsulated material 114 is deposited such that the encapsulated material 114 surrounds the IC dies 150a and 150b, to form the reconstituted layer 710. After, the reconstituted layer 710 is separated from the carrier 310, and the steps 210-226, 230, and 232 can be performed in the manufacturing process, as previously described.

Exemplary IC Package with Additional Dielectric Layers

Figure 8:
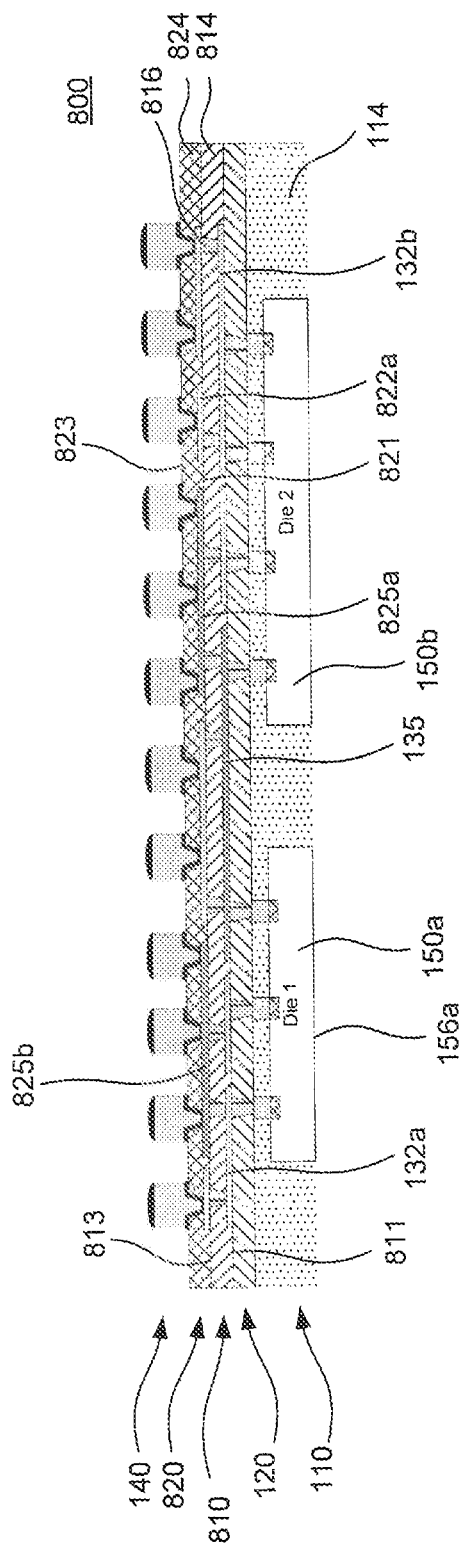
FIG. 8 illustrates a cross-sectional view of an integrated circuit (IC) chip package according to embodiments of the disclosure.

FIG. 8 illustrates another embodiment of an IC package according to embodiments of the disclosure. As illustrated by FIG. 8, an IC package 800 can be formed with additional RDLs and bridge interconnect layers to facilitate additional electrical connection paths between a die (e.g., die 150a) and the external connect layer 140 or another die (e.g., die 150b). For example, the IC package 800 includes a reconstituted layer 110, the first dielectric layer 120, a second dielectric layer 810, a third dielectric layer 820, and the external connect layer 140.

The second dielectric layer 810 includes the RDLs 132a and 132b and the bridge interconnect layer 135, similar to the second dielectric layer 120. However, the second dielectric layer 810 also includes vias 816 and a second dielectric material 814. The vias 816 bond to the RDLs 132a and 132b and the bridge interconnect layer 135 to provide electrical connection paths between the first dielectric layer 120 and the third dielectric layer 820. The vias 816 are made of a conductive material such as copper, gold, silver, or aluminum. The second dielectric material 814 forms the surfaces of the second dielectric layer 810. In particular, the second dielectric material 814 forms a first surface 811 and a second surface 813 of the second dielectric layer 810. The first surface 811 contacts the second surface 123 of the first dielectric layer 120, and the second surface 813 of the second dielectric layer 810 forms the base for the third dielectric layer 820. The second dielectric material 814 is formed of a material that facilitates substantial reduction of mechanical stresses on the IC package 800 as well as minimizing warpage of IC package 800. The second dielectric material 814 may be formed of the same material as the first dielectric material 124, or of a different material. The second dielectric material 814 can be formed of such material as polybenzoxazoles, polyimides, benzocylobutene, silicone elastomers, acrylate, silicon oxide, or high K dielectric material, and/or an epoxy.

Further, the third dielectric layer 820 includes RDLs 822a and 822b, bridge interconnect layers 825a and 825b, the third dielectric material 824, and the UBM layer 136. The RDLs 822a and 822b and the bridge interconnect layers 825a and 825b are conductive layers configured to distribute the electrical connection paths from the vias 816 of the second dielectric layer 810 to the external connect layer 140. The RDLs 822a and 822b and the bridge interconnect layers 825a and 825b can distribute the electrical paths by way of leads or traces. The bridge interconnect layers 825a and 825b additionally provide an interconnect between the RDLs 132a and 132b and the bridge interconnect layer 135.

The RDLs 822a and 822b and the bridge interconnect layers 825a and 825b are made of a conductive material such as copper, gold, silver, or aluminum. The third dielectric material 824 forms the surfaces of the external connect layer 140. In particular, the third dielectric material 824 forms a first surface 821 and a second surface 823 of the third dielectric layer 820. The first surface 821 contacts the second surface 813 of the second dielectric layer 810, and the second surface 823 of the third dielectric layer 820 forms the base for the external connect layer 140. The third dielectric material 824 is formed of a material that facilitates substantial reduction of mechanical stresses on the IC package 800 as well as minimizing warpage of IC package 800. The third dielectric material 824 may be formed of the same material as the second dielectric material 814, or of a different material. The third dielectric material 824 may be formed of such material as can be formed of such material as polybenzoxazoles, polyimides, benzocylobutene, silicone elastomers, acrylate, silicon oxide, or high K dielectric material, and/or an epoxy.

During manufacturing, steps 202-216 are performed as described above. After the RDLs 132a and 132b and bridge interconnect layer 135 are formed in step 216, the second dielectric material 814 is formed on the second surface 123 of the first dielectric layer 120, similar to step 218. Next, via holes are formed in the second dielectric material 814, similar to the process described by step 212, to expose portions of the RDLs 132a and 132b and bridge interconnect layer 135. The vias 816 are then formed, similar to the process described by step 214, to contact the RDLs 132a and 132b and bridge interconnect layer 135 by a bonding process or a metal layering process. The RDLs 822a and 822b and bridge interconnect layers 825a and 825b are formed on the second surface 813 of the second dielectric layer 810, similar to the process described by step 216. Next, the third dielectric material 824 is formed on the second surface 813 of the second dielectric layer 810, similar to the process described by step 218, to provide a base on which the external connect layer 140 is formed. After which, the remaining steps 220-222 can be performed in the manufacturing process.

Conclusion

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The foregoing disclosure outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) package, comprising:
    an encapsulated layer, including:
        an encapsulating material that forms opposing first and second surfaces of the encapsulated layer;
        first and second IC dies, each having input/output (I/O) pads encapsulated by the encapsulating material; and
        die connections positioned within the encapsulating material, wherein each die connection is connected to a corresponding I/O pad of the I/O pads of the first and second IC dies;
    a first dielectric layer, including:
        a first dielectric material that forms, opposing first and second surfaces of the first dielectric layer, the first surface of the first dielectric layer disposed on the second surface of the encapsulated layer; and
        a first plurality of vertical vias positioned within the first dielectric material and configured to provide an electrical path for the I/O pads of the first and second IC dies, wherein each of the first plurality of vertical vias is positioned above and directly in contact with a corresponding die connection of the die connections;
    a second dielectric layer, including:
        a second dielectric material that forms opposing first and second surfaces of the second dielectric layer, the first surface of the second dielectric layer disposed on the second surface of the first dielectric layer;
        a first bridge interconnect layer positioned within the second dielectric material and in contact with at least a first vertical via and a second vertical via of the first plurality of vertical vias to provide an electrical path between respective I/O pads of the first and second IC dies;
        a first redistribution layer positioned within the second dielectric material and in contact with a third vertical via of the first plurality of vertical vias; and
        a second plurality of vertical vias positioned within the second dielectric material, a first vertical via of the second plurality of vertical vias in contact with the first bridge interconnect layer and a second vertical via of the second plurality of vertical vias in contact with the first redistribution layer; and
    a third dielectric layer, including:
        a third dielectric material that forms opposing first and second surfaces of the third dielectric layer, the first surface of the third dielectric layer disposed on the second surface of the second dielectric layer; and
        a second bridge interconnect layer positioned within the third dielectric material and in contact with the first and second vertical vias of the second plurality of vertical vias to provide an electrical path between the first bridge interconnect layer and the first redistribution layer of the second dielectric layer IC dies.

2. The IC package of claim 1, wherein the first vertical vias and the first bridge interconnect layer are formed of a same conductive material.

3. The IC package of claim 1, wherein the die connections are formed of a same conductive material as the first plurality of vertical vias and the first bridge interconnect layer.

4. The IC package of claim 1, wherein the third dielectric layer further includes an under bump metallization (UBM) layer in contact with the second bridge interconnect layer.

5. The IC package of claim 4, wherein the UBM layer is formed of a same conductive material as the second plurality of vertical vias and the second bridge interconnect layer.

6. The IC package of claim 4, further comprising conductive pillars configured to contact the UBM layer.

7. The IC package of claim 6, wherein the conductive pillars are formed of a same conductive material as the second plurality of vertical vias, the second bridge interconnect layer, and the UBM layer.

8. The IC package of claim 7, wherein the second dielectric layer further includes a second redistribution layer positioned within the second dielectric layer and in contact with a fourth vertical via of the first plurality of vertical vias.

9. The IC package of claim 1, wherein a non-active surface of each of the first and second IC dies are positioned on a same plane.

10. The IC package of claim 1, wherein the first dielectric material is a different material than the second dielectric material.

11. The IC package of claim 1, further comprising a heat spreader disposed in contact with a non-active surface of each of the first and second IC dies.

12. The IC package of claim 1, wherein the first and second IC dies have non-active surfaces encapsulated by the encapsulated material.

13. An integrated circuit (IC) package, comprising:
an encapsulated layer, including:
an encapsulating material that forms opposing first and second surfaces of the encapsulated layer;
first and second IC dies, each having input/output (I/O) pads encapsulated by the encapsulating material; and
die connections positioned within the encapsulating material, wherein each die connection is connected to a corresponding I/O pad of the I/O pads of the first and second IC dies;
a first dielectric layer, including:
a first dielectric material that forms opposing first and second surfaces of the first dielectric layer, the first surface of the first dielectric layer disposed on the second surface of the encapsulated layer; and
a first plurality of vertical vias positioned within the first dielectric material and configured to provide an electrical path for the I/O pads of the first and second IC dies, wherein each of the first plurality of vertical vias is positioned above and directly in contact with a corresponding die connection of the die connections;
a second dielectric layer, including:
a second dielectric material that forms opposing first and second surfaces of the second dielectric layer, the first surface of the second dielectric layer disposed on the second surface of the first dielectric layer;
a first bridge interconnect layer positioned within the second dielectric material and in contact with at least a first vertical via and a second vertical via of the first plurality of vertical vias to provide an electrical path between respective I/O pads of the first and second IC dies;
a first redistribution layer positioned within the second dielectric material and in contact with a third vertical via of the first plurality of vertical vias; and
a second plurality of vertical vias positioned within the second dielectric material, a first vertical via of the second plurality of vertical vias in contact with the first bridge interconnect layer and a second vertical via of the second plurality of vertical vias in contact with the first redistribution layer; and
a third dielectric layer, including:
a third dielectric material that forms opposing first and second surfaces of the third dielectric layer, the first surface of the third dielectric layer disposed on the second surface of the second dielectric layer; and
a second redistribution layer positioned within the third dielectric material and in contact with the second vertical via of the second plurality of vertical vias.

14. The IC package of claim 13, wherein the first vertical vias and the first bridge interconnect layer are formed of a same conductive material.

15. The IC package of claim 13, wherein the die connections are formed of a same conductive material as the first plurality of vertical vias and the first bridge interconnect layer.

16. The IC package of claim 13, wherein the third dielectric layer further includes an under bump metallization (UBM) layer in contact with the second redistribution layer.

17. The IC package of claim 16, further comprising conductive pillars configured to contact the UBM layer.

18. The IC package of claim 17, wherein the conductive pillars are fainted of a same conductive material as the second plurality of vertical vias, the second redistribution layer, and the UBM layer.

19. The IC package of claim 11, wherein the first dielectric material is silicon oxide and the second dielectric material is a polyimide.

20. The IC package of claim 13, wherein the first dielectric material is silicon oxide and the second dielectric material is an epoxy.

* * * * *

UNITED STATES PATENT AND TRADEMARK OFFICE
CERTIFICATE OF CORRECTION

PATENT NO. : 10,276,403 B2
APPLICATION NO. : 15/198991
DATED : April 30, 2019
INVENTOR(S) : Zhao et al.

Page 1 of 1

It is certified that error appears in the above-identified patent and that said Letters Patent is hereby corrected as shown below:

In the Claims

In Column 10, Lines 10-11 replace "a first dielectric material that forms, opposing first and second surfaces of the first dielectric layer," with -- a first dielectric material that forms opposing first and second surfaces of the first dielectric layer, --.

Signed and Sealed this
Twenty-ninth Day of October, 2019

Andrei Iancu
*Director of the United States Patent and Trademark Office*